(12) United States Patent
Malocha et al.

(10) Patent No.: US 9,097,054 B2
(45) Date of Patent: Aug. 4, 2015

(54) IMPLEMENTATION OF ON-OFF PASSIVE WIRELESS SURFACE ACOUSTIC WAVE SENSOR USING CODING AND SWITCHING TECHNIQUES

(71) Applicant: University of Central Florida Research Foundation, Inc., Orlando, FL (US)

(72) Inventors: Donald Malocha, Winter Springs, FL (US); Nikolai Kozlovski, Winter Springs, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 14/164,752

(22) Filed: Jan. 27, 2014

(65) Prior Publication Data

US 2014/0137473 A1    May 22, 2014

Related U.S. Application Data

(60) Division of application No. 13/151,493, filed on Jun. 2, 2011, now Pat. No. 8,669,871, which is a continuation-in-part of application No. 12/618,034, filed on Nov. 13, 2009, now Pat. No. 7,952,482.

(51) Int. Cl.

| | |
|---|---|
| *G08B 13/14* | (2006.01) |
| *E05F 15/20* | (2006.01) |
| *G06K 19/067* | (2006.01) |
| *H03H 9/64* | (2006.01) |

(Continued)

(52) U.S. Cl.
CPC .............. *E05F 15/20* (2013.01); *B06B 1/0622* (2013.01); *E05F 15/70* (2015.01); *G06K 19/0672* (2013.01); *G06K 19/0675* (2013.01); *H03H 9/642* (2013.01); *Y10T 29/49005* (2015.01)

(58) Field of Classification Search
CPC .......... G06K 19/0672; G06K 19/0675; H03H 9/642; Y10T 29/49005; B06B 1/0622; E05F 15/20; E05F 15/70
USPC ................... 340/572.1–572.9, 870.01, 870.3, 340/870.31, 853.1, 854.3, 854.6, 854.8
See application file for complete search history.

(56) References Cited

U.S. PATENT DOCUMENTS

| | | | |
|---|---|---|---|
| 4,103,339 A | 7/1978 | Hubbell | |
| 4,586,077 A * | 4/1986 | Wonn et al. | ................... 725/149 |

(Continued)

FOREIGN PATENT DOCUMENTS

| | | |
|---|---|---|
| JP | 2000183847 | 6/2000 |
| WO | 2006046108 | 5/2006 |

OTHER PUBLICATIONS

Malocha, International Preliminary Report, mailed Dec. 12, 2013, PCT/US11/44139, 6 pgs.

*Primary Examiner* — Daniel Previl

(74) *Attorney, Agent, or Firm* — Jetter & Associates, P.A.

(57) ABSTRACT

Methods and systems for passive wireless surface acoustic wave devices for orthogonal frequency coded devices to implement ON-OFF sensors reusing orthogonal frequency code and distinguishing between ON and OFF states using additional PN sequence and on/off switches producing multi-level coding as well as external stimuli for switching and identification of a closure system. An embodiment adds a level of diversity by adding a dibit to each surface acoustic wave devices, thus providing four different possible coding states. The PN on-off coding can be with the dibit for coding in a multi-tag system.

9 Claims, 3 Drawing Sheets

(51) Int. Cl.
 B06B 1/06 (2006.01)
 E05F 15/70 (2015.01)

(56) References Cited

U.S. PATENT DOCUMENTS

| | | | |
|---|---|---|---|
| 5,018,202 A * | 5/1991 | Takahashi et al. | 381/71.5 |
| 5,121,249 A | 6/1992 | Fellows | |
| 5,481,414 A * | 1/1996 | Takada et al. | 360/64 |
| 6,008,643 A | 12/1999 | Mani | |
| 6,046,657 A * | 4/2000 | Alers et al. | 333/150 |
| 7,522,016 B2 | 4/2009 | Toncich | |
| 7,952,482 B2 | 5/2011 | Malocha | |
| 8,169,320 B2 | 5/2012 | Malocha | |
| 2003/0016735 A1 * | 1/2003 | Edmonson et al. | 375/219 |
| 2006/0036515 A1 | 2/2006 | Ingalsbe | |
| 2007/0296305 A1 | 12/2007 | Hines | |
| 2009/0109048 A1 | 4/2009 | Spivak | |
| 2010/0144305 A1 * | 6/2010 | Cook et al. | 455/334 |

* cited by examiner

IMPLEMENTATION OF ON-OFF PASSIVE WIRELESS SURFACE ACOUSTIC WAVE SENSOR USING CODING AND SWITCHING TECHNIQUES

This application is a divisional of U.S. patent application Ser. No. 13/151,493, filed Jun. 2, 2011, now allowed, which is a Continuation-In-Part of U.S. patent application Ser. No. 12/618,034 filed on Nov. 13, 2009, now U.S. Pat. No. 7,952,482. The entire disclosure of each of the applications listed in this paragraph are incorporated herein by specific reference thereto.

FIELD OF THE INVENTION

This invention relates to surface acoustic wave devices and, in particular, to methods, systems and devices for on-off passive wireless surface acoustic sensors using coding in combination with on-off switching where the same orthogonal frequency code is used for both ON and OFF states.

BACKGROUND AND PRIOR ART

The surface acoustic wave (SAW) sensor offers advantages in that it is wireless, passive, small and has varying embodiments for different sensor applications. Surface acoustic wave sensors are capable of measuring physical, chemical and biological variables and have the ability to operate in harsh environments. In addition, there are a variety of ways of encoding the sensed data information for retrieval. Single sensor systems can typically use a single carrier RF frequency and a simple device embodiment, since tagging is not required. In a multi-sensor environment, it is necessary to both identify the sensor as well as obtain the sensed information. The SAW sensor then becomes both a sensor and a tag and must transmit identification and sensor information simultaneously.

Known SAW devices include delay lines and resonator-based oscillators, differential delay lines, and devices utilizing multiple reflective. Single sensor systems can typically use a single carrier frequency and a simple coding technique, since tagging is not required. However, there are advantages of using spread spectrum techniques for device interrogation and coding, such as enhanced processing gain and greater interrogation power.

The use of orthogonal frequencies for a wealth of communication and signal processing applications is well known to those skilled in the art. Orthogonal frequencies are often used in an M-ary frequency shift keying (FSK) system. There is a required relationship between the local, or basis set, frequencies and their bandwidths which meets the orthogonality condition. If adjacent time chips have contiguous local stepped frequencies, then a stepped chirp response is obtained.

Other known SAW devices include delay line and resonator-based oscillators, differential delay lines, and devices utilizing multiple reflective structures where the reflector length determines a single chip length. The amplitude, phase and delay of each chip can be different from adjacent chips and the sum of all chips yield the code sequence. In this serial approach, the greater the number of codes required, the longer the length of the device.

Known prior art includes U.S. Patent Application No. 2005/0100338 which teaches a two-dimensional wavelength/time optical CDMA system employing balanced-modified pseudo random noise matrix codes. Through an inverse-exclusive OR operation of a pair of modified PN code, the balanced codes are generated as optical CDMA codes in the form of a new matrix. When the codes are applied to an optical CDMA system to perform encoding and decoding, if the same number of channels as the number (M-1) of subgroups of the codes are connected, the system becomes an MAI-free system, and even if the number of channels connected is twice the number of the subgroups, an error-free system can be established. Accordingly, the number of channels that can be used simultaneously is doubled compared to the prior art method such that the economical efficiency of the optical CDMA system improves.

U.S. Patent Application No. 2008/0156100 published on Jul. 3, 2008 teaches an acoustic wave sensor array device for the detection, identification, and quantification of chemicals and biological elements dispersed in fluids. The sensor array device is capable of the simultaneous characterization of a fluid for multiple analytes of interest. A substrate has a plurality of channels formed therein and a sensor material layer applied in a bottom of the channels. The sensor material layer has a shear acoustic wave speed lower than a shear acoustic wave speed in said substrate. The channels may have the same material in each channel or different materials in at least two of the channels. A surface acoustic wave transducer and at least one surface acoustic wave reflector, or at least two transducers is formed on a surface of the substrate opposite the channels at a portion of the substrate that is thinned by the channels, so that the acoustic tracks of the surface acoustic wave device extend along the channels. The response of the surface acoustic wave depends on the response of the sensor material to a sensed fluid supplied to the channels.

U.S. Pat. No. 7,817,707 issued Oct. 19, 2010 teaches an apparatus for generating a ranging pseudo noise (PN) code used in a base station of a portable internet system of an orthogonal frequency division multiplexing access scheme, wherein a ranging pseudo noise mask value is generated using a cell ID number, and then the generated ranging pseudo noise mask value is stored in a memory. A final ranging PN code is generated using the stored ranging PN mask value and a status of a pseudo random binary sequence for generating a ranging PN code. With such a structure, the maximal 256-numbered ranging PN code values can be obtained simultaneously with each 144 bit-length.

Patents and patent applications by an inventor of the present invention, and assigned to the same assignee, and which are incorporated by reference, include U.S. Pat. Nos. 7,642,898, 7,777,625, 7,825,805, and 7,623,037. U.S. Pat. No. 7,642,898 issued on Jan. 5, 2010 to Malocha which teaches orthogonal frequency coding for surface acoustic wave identification tags and sensors to enable unique sensor operation and identification for a multi-sensor environment. In an embodiment, a pseudo noise sequence is applied to the OFC for increased security. An OFC technique is applied to the SAW tag using periodic reflector gratings for responding to an orthogonal interrogation signal to transmit the sensor identification and sensed data. A transceiver interrogates the sensor with a stepped chirp corresponding to the orthogonal frequency coded chip frequency response, receives a response from the SAW device, applies an oppositely stepped chirp to the response and then uses matched filtering to produce a compressed pulse. The orthogonal frequency coding technique has an inherent advantage of processing gain, code division multiple access, spread spectrum and security.

U.S. Pat. No. 7,777,625 issued on Aug. 17, 2010 to Puccio and Malocha, which discloses a weighted surface acoustic wave reflector gratings for coding identification tags and sensors to enable unique sensor operation and identification for a multi-sensor environment. In an embodiment, the weighted reflectors are variable while in another embodiment the reflector gratings are apodized. The weighting technique allows the designer to decrease reflectively and allows for more chips to be implemented in a device and, consequently, more coding diversity. As a result, more tags and sensors can be implemented using a given bandwidth when compared with uniform reflectors. Use of weighted reflector gratings with OFC makes various phase shifting schemes possible, such as in-phase and quadrature implementations of coded waveforms resulting in reduced device size and increased coding.

U.S. Pat. No. 7,825,805 issued on Nov. 2, 2010 to Malocha, which teaches systems, devices and methods for providing an orthogonal frequency coding technique for surface acoustic wave sensors incorporating the use of multiple parallel acoustic tracks to provide increased coding by phase shifting and delaying a code sequence. The surface acoustic wave sensor includes parallel tracks with multiple reflectors with differing delay offsets to form a complex code sequence. The reflectors may be uniform, but alternatively could include fingers withdrawn, have reflector position modulation, differing frequencies or be spatially weighted.

U.S. Pat. No. 7,623,037 issued on Nov. 24, 2011 to Malocha discloses a SAW sensor or tag having multiple transducer/antenna pairs each having a different center frequency. The bandwidth of each transducer/antenna pair is inversely proportional to the number of transducer/antennas pairs used and the bandwidth is the sum of the bandwidth of the transducer/antenna pairs. Implementing a SAW sensor or tag with multiple transducer/antenna pairs significantly reduces device losses and improves the performance of the device since the individual transducer/antenna pair's fractional bandwidth is reduced by the ratio of the system bandwidth to the number of transducer antenna pairs used in the sensor.

To solve the problems associated with the prior art systems, methods and systems of the present invention provides a novel type surface acoustic wave devices with on-off capabilities for passive wireless surface acoustic wave devices.

SUMMARY OF THE INVENTION

A primary objective of the present invention is to provide methods, systems and devices to implement a passive wireless orthogonal frequency coded surface acoustic wave ON-OFF sensor that uses the same code for both ON and OFF states.

A secondary objective of the present invention is to provide methods, systems and devices for a surface acoustic wave device design for orthogonal frequency coded devices to implement ON-OFF sensors reusing orthogonal frequency code and distinguishing between ON and OFF states using additional PN sequence and on/off switches producing multi-level coding as well as external stimuli for switching and identification of a closure system.

A third objective of the present invention is to provide methods, systems and devices for increasing code diversity by adding for dibit coding for surface acoustic wave devices. A dibit, i.e., two adjoining bits, each having the same chip frequency (in the case of a reflector they would have the same Bragg frequency), would be encoded in an orthogonal manner and each have a different dibit code as a unique code sequences.

A fourth objective of the present invention is to provide methods, systems and devices for wireless external closure detection to verify that a signal is present to ensure that a wireless communication link is established and that the device is operational such as using a single external REED switch for magnetic closure detection, single channel or parallel channels.

A fifth objective of the present invention is to provide methods, systems and devices for wireless external closure detection to verify that a signal is present to ensure that a wireless communication link is established and that the device is operational using two REED switches, one normally on, and one normally off with the two switches switching parallel channels when magnetic field is present.

A sixth objective of the present invention is to provide methods, systems and devices for use of a thin film ferromagnetic material to change either delay, loss or frequency of the encoded device when the thin film ferromagnetic material is placed in a delay path, on a transducer or placed on one or more of the surface acoustic wave device reflectors.

A seventh objective of the present invention is to provide methods, systems and devices to integrate a magnet atop of, or under the device, in a manner to change the delay, loss or frequency of the encoded device. This can be accomplished by damping the wave, or applying a strain induced change in the device's effective material properties or physical parameters.

An eighth objective of the present invention is to provide methods, systems and devices to integrate a ferromagnetic material atop of, or under the device, in a manner to change the delay, loss or frequency of the encoded device. This can be accomplished by damping the wave, or applying a strain induced change in the device's effective material properties or physical parameters.

Further objects and advantages of this invention will be apparent from the following detailed description of preferred embodiments which are illustrated schematically in the accompanying drawings.

DESCRIPTION OF THE PREFERRED EMBODIMENTS

Figure 1A:
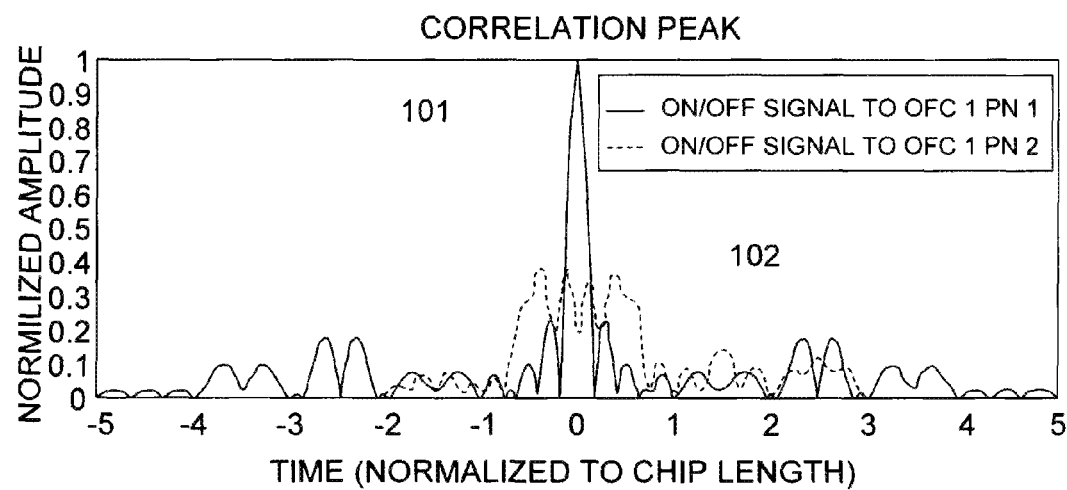
FIG. 1a is a graph showing an example of a matched filter correlation of the same OFC code with PN1 sequence for ON state and PN2 sequence for OFF state to the simulated ideal sensor response in ON state plotted versus time normalized to chip length.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of reference numerals used in the description and the drawings to identify components:

| | |
|---|---|
| 101 | ON state |
| 102 | OFF state |
| 103 | ON state |
| 104 | OFF state |
| 201 | master network |
| 202 | output port |
| 203 | switch |
| 204 | external stimuli |
| 205 | input port |
| 206 | input port |
| 207 | input port |
| 208 | transducer |
| 209 | reflectors |
| 210 | transducer |
| 211 | reflectors |
| 212 | transducer |
| 213 | OFC chip reflectors |
| 214 | offset |
| 215 | offset |
| 216 | acoustical path |
| 217 | acoustical path |
| 218 | acoustical path |

U.S. application Ser. No. 12/618,034 filed on filed on Nov. 13, 2009, now U.S. Pat. No. 7,952,482, having the same inventor as the present invention and assigned to the same assignee, which is incorporated herein by reference, teaches methods and systems for coding SAW OFC devices to mitigate code collisions in a wireless multi-tag system. Each device produces an OFC signal with a chip offset delay to increase code diversity.

The method for assigning a different OCF to each device includes using a matrix based on the number of OFCs needed and the number chips per code, populating each matrix cell with OFC chip, and assigning the codes from the matrix to the devices. The asynchronous passive multi-tag system includes plural SAW devices each producing a different OFC signal with the same number of chips and including a chip offset time delay, an algorithm for assigning OFCs to each device, and a transceiver to transmit an interrogation signal and receive OFC signals in response with minimal code collisions during transmission. The '034 patent application demonstrated a cell-based approach for device coding. A sample set is given in the following Table 1.

TABLE 1

| Device 1 | | Time Slot | | | | |
|---|---|---|---|---|---|---|
| | | 1 | 2 | 3 | 4 | 5 |
| Device # | 1 | 5 | 3 | 1 | 4 | 2 |
| | 2 | 4 | 2 | 5 | 3 | 1 |
| | 3 | 3 | 1 | 4 | 2 | 5 |
| | 4 | 2 | 5 | 3 | 1 | 4 |
| | 5 | 1 | 4 | 2 | 5 | 3 |

This approach can be extended to the passive wireless OFC SAW on-off sensors when the OFC does not change but the PN coding on top of OFC does. Table 2 demonstrates a set of OFC-PN devices. In a preferred embodiment, when external stimuli are applied to the sensors, the OFC stays the same, however, the PN coding is changing. For a multi-sensor system, the PN coding for ON and OFF states does not have to be different from one OFC code to another.

TABLE 2

| Device 1 | | | Time Slot | | | | | Code |
|---|---|---|---|---|---|---|---|---|
| | | | 1 | 2 | 3 | 4 | 5 | Name |
| Device # | 1 | ON | +5 | +3 | +1 | −4 | +2 | OFC1-PN1 |
| | | OFF | −5 | −3 | +1 | −4 | +2 | OFC1-PN2 |
| | 2 | ON | +4 | +2 | +5 | −3 | +1 | OFC2-PN1 |
| | | OFF | −4 | −2 | +5 | −3 | +1 | OFC2-PN2 |
| | 3 | ON | +3 | +1 | +4 | −2 | +5 | OFC3-PN1 |
| | | OFF | −3 | −1 | +4 | −2 | +5 | OFC3-PN2 |
| | 4 | ON | +2 | +5 | +3 | −1 | +4 | OFC4-PN1 |
| | | OFF | −2 | −5 | +3 | −1 | +4 | OFC4-PN2 |
| | 5 | ON | +1 | +4 | +2 | −5 | +3 | OFC5-PN1 |
| | | OFF | −1 | −4 | +2 | −5 | +3 | OFC5-PN2 |

When the sensor is interrogated, the reflected response is correlated against both ON and OFF codes. Referring to Table 2, for device 1, the two codes are OFC1-PN1 and OFC1-PN2, (orthogonal frequency code 1, with a PN of on or off).

Figure 1B:
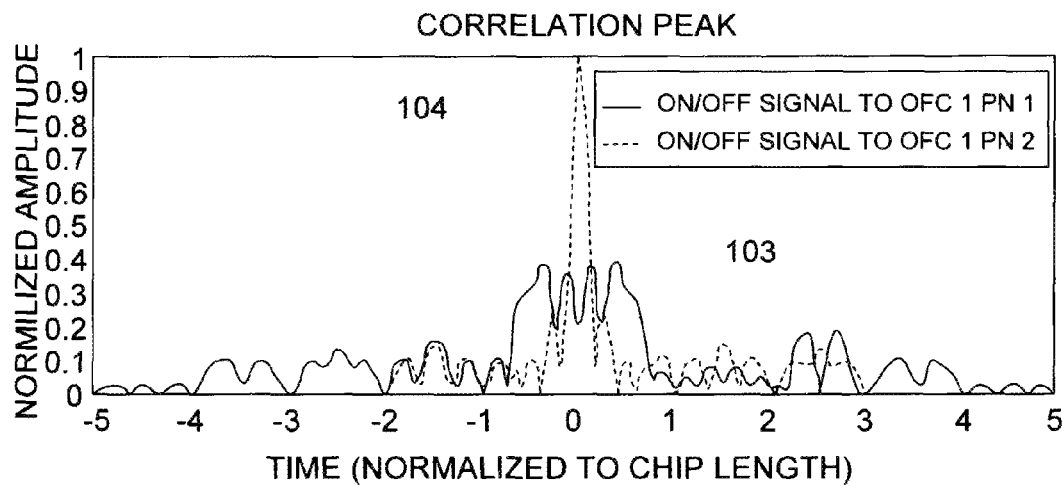
FIG. 1b is a graph showing an example of a matched filter correlation of the same OFC code with PN1 sequence for ON state and PN2 sequence for OFF state to the simulated ideal sensor response in OFF state plotted versus time normalized to chip length.

FIGS. 1a and 1b show an example of a matched filter correlation of the same OFC code with PN1 sequence for the ON state and PN2 sequence for OFF state to the simulated ideal sensor response in ON state 101 plotted versus time normalized to chip length. As shown, an ideal device simulation in an ON state 101 correlates to OFC1-PN1 and OFC1-PN2 correlates to the OFF state 102. Whichever yields the highest correlation peak corresponds to the state of the sensor. In FIG. 1a, the ON state 101 waveform response has the highest peak and the OFF state 102 is shown with a peak that is lower than the ON state peak. In FIG. 1b, the device with OFC1 code is modeled in an OFF state. In FIG. 1b, correlation to OFC1-PN2 is in an ON state 104 has a higher peak than the correlation to the OFC1-PN1 which is in an OFF state 103 shown as a lower peak. Referring to FIG. 1a in conjunction with FIG. 1b, for the best distinction between correlations of PN1 to PN2 it is necessary for half of the chips to have one sign and the other half having the opposite sign.

Figure 2:
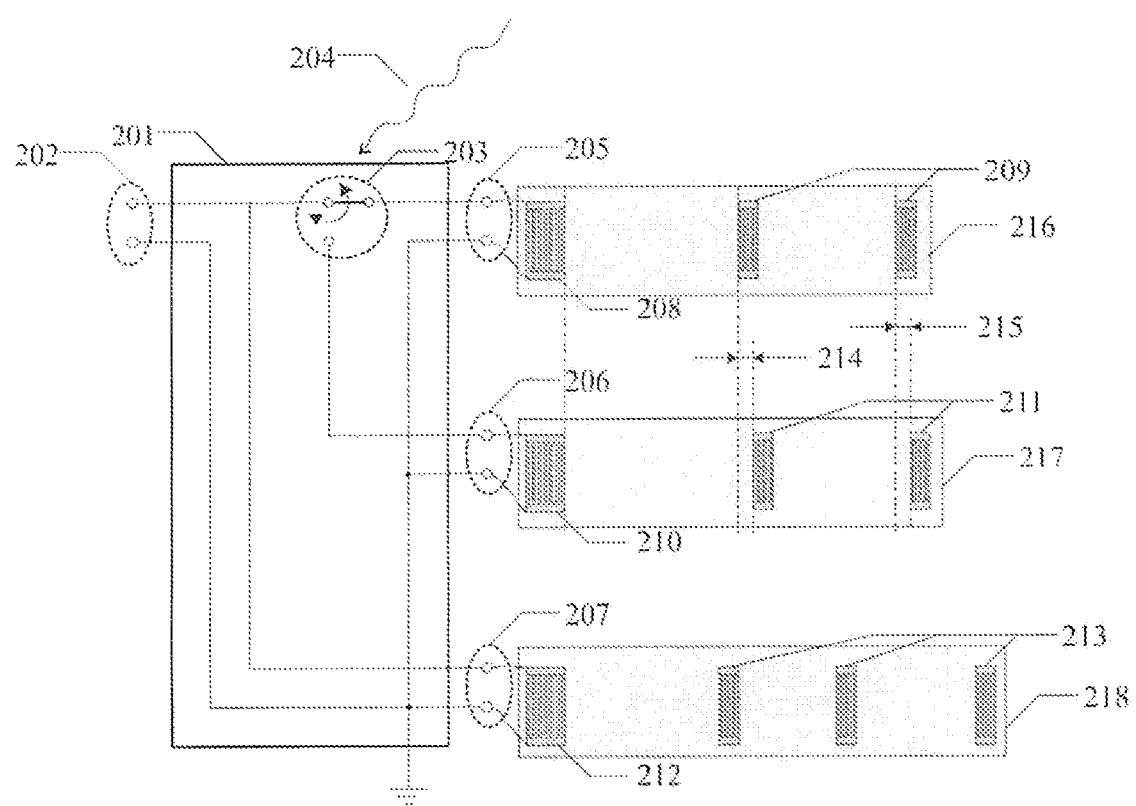
FIG. 2 is a schematic showing an example of ON-OFF OFC SAW sensor according to the present invention.

FIG. 2 is a schematic diagram showing an example of an ON-OFF OFC surface acoustic wave device implementation. The example shown in FIG. 2 is for illustration only to demonstrates the principle of the preferred embodiment and is not intended to limit the invention to any particular number of transducers, reflectors, acoustical paths or to limit the types of switches that can be used. The switches can be magnetic, photovoltaic, mechanical, or other type of switch. For example, the switch can be a reed switch or an optical sensors.

The electrical master network 201 provides the electrical interface connections between the multiple electrical input ports 205, 206, and 207 of the transducers 208, 210 and 212 with the switch 203. In the example shown, the switch 203 is controlled by external stimuli 204. The output port 202 of the electrical master network 201 can be connected to an antenna or matching network (not shown). The device can include a number of acoustical paths, three acoustical paths 216, 217, and 218 in the example shown.

One acoustical path 218, or a set of acoustical paths shown in FIG. 2 includes three OFC chips 213 that do not change and do not include on-of coding. The transducer 212 for this path 218 can be connected directly to the output port 202 of the master network 201. The two other acoustical paths 216 and 217, or two sets of multiple acoustical paths, can contain OFC chips with both changing and non-changing PN code.

The first acoustical paths 216 in FIG. 2 having chips with alternating PN codes can be called a reference path 216. For the second acoustical path 217, the distance from the transducer 210 to the two reflectors with alternating PN codes 211 changes by an odd integer multiple of a quarter wavelength of the reflectors center compared to the distance between corresponding reflectors 209 to the transducer 208 of the reference path 216. The transducers 208 and 210 of the reference path 216 and the second path 217, respectively, are then connected to input ports 205 and 206, respectively, of the master network 201. Depending on the external stimuli 204 applied to the switch 203, one or the other transducer 208 or 210 will be connected to the output 202 of the master network 201.

Dibit Coding:

In another embodiment of the present invention, a dibit, i.e., two adjoining bits, each having the same chip frequency, would be encoded in an orthogonal manner. For example, in the case of a reflector they would have the same Bragg frequency. The on-off PN coding approach previously discussed could also be applied. Multiple dibit chips with differing chip frequencies, such as in orthogonal frequency coded devices previously published by the inventor, could be constructed with unique code sequences.

Figure 3:
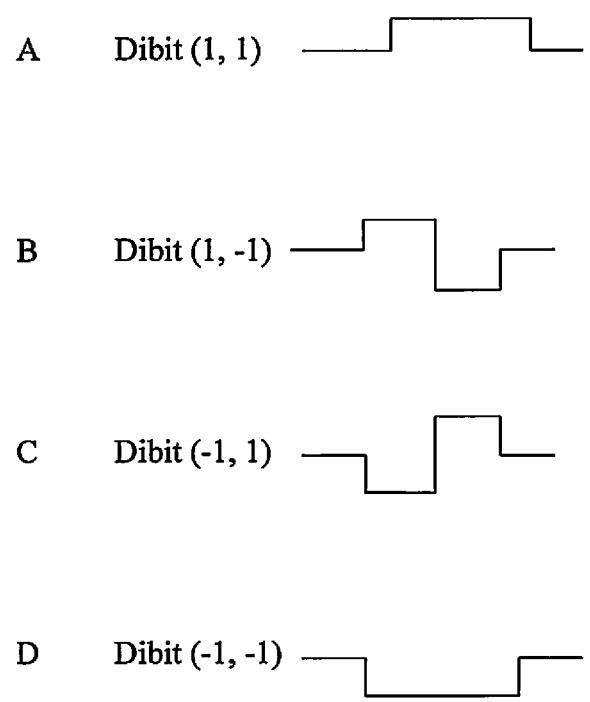
FIG. 3 shows the dibit encoding that provides four possible coding states that can be added to device coding to increase coding diversity.

The envelope of the dibit encoding is shown FIG. 3, with A having a dibit of 1 and 1 and with B having a dibit of 1 and −1. The complement can also be encoded, namely D a dibit of −1 and −1 as the complement for A and C a dibit of −1, 1 as the complement for B. In general, as shown in FIG. 3, this provides four possible coding states. Although the carrier frequency is not shown, the carrier frequency can be the same for each device with the dibit adding to the number a surface acoustic wave devices that can be used in a wireless multi-tag system.

As an example, if each bit is implemented as a Bragg reflector on an OFC device, with A in channel 1 and B in channel 2, then the sum and differences and the on and off states can be used for device encoding. Further, let's assume in channel 2, which uses dibit B, there is an external switch that can be used to engage (on) or disengage (off) channel 2. Further, the outputs after any switch are summed. If channel 2 is off, then the output will simply be a code 1,1 in the adjacent bits, with a normalized amplitude of 1 and a length $2 \cdot T_{bit}$. When the switch is on, the sum of the dibits will be a 1,0 in adjacent bits, with a normalized amplitude of 2 and length $T_{bit}$. The energy in both of the received coded information will be the same. The autocorrelation of dibit A and dibit B provide a peak triangular correlation at t=0. The cross-correlation to one another yields a zero at t=0 and the integral across the dibit period for the cross correlation is zero. This approach provides orthogonal coding and a good use of the spectral frequency bandwidth by using orthogonal codes. When used in a multi-chip OFC system, PN coding of the dibits will provide even greater diversity.

Wireless External Closure Detection:

The following embodiment is for use of magnetic switch closure in conjunction with SAW sensor techniques. It is not necessary for the sensor encoding to be orthogonal frequency coding. The magnetic switch can be used separately for SAW closure sensors, or in conjunction with the previously described encoding techniques. It is recognized that in many applications it is necessary to verify that a signal is present to ensure that a wireless communication link is established and that the device is operational. Therefore, the preferred embodiment is for a signal to be detected with the sensor in one of the closed or open state. However, if only an on-state is required, the system need have only a single channel.

External Switch for Connecting and Disconnecting Channels:

For example, an external REED switch is used for connecting and disconnecting a channel. Here, a single REED switch can be used for magnetic closure detection in a single channel or for parallel channels. In another example, two REED switches, one that is normally on and the other being normally off then the two REED switches can switch parallel channels when a magnetic field is present. Although this embodiment is described for a REED switch, those skilled in the art will understand that other types of switches, such as an optical sensor, can be substituted without departing from the scope of this embodiment of the present invention.

Integrated SAW Closure Sensor:

In an alternative embodiment, 1*a* thin film ferromagnetic material is used to change either delay, loss or frequency of the encoded device. The thin film ferromagnetic material can be placed in the delay path, on the transducer, or can be place on one or more reflectors. Alternatively, a magnet can be integrated on top of, or under the device in a manner that can change the delay, loss or frequency of the encoded device. This change can be accomplished by damping the wave, or applying a strain induced change in the device's effective material properties or physical parameters. In yet another alternative configuration, a ferromagnetic material can be integrated on top of, or under the device, in a manner to change the delay, loss or frequency of the encoded device. This can be accomplished by damping the wave, or applying a strain induced change in the device's effective material properties or physical parameters.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A surface acoustic wave (SAW) device-based communications system, comprising:
    a first SAW device including a first transducer and reflectors in a first acoustic path providing a first orthogonal frequency code (OFC), at least a second SAW device including a second transducer and reflectors in a second acoustic path providing a second OFC different from the first OFC;
    a magnetic switch having a first input port, a second input port, and an output port, the first input port connected to an input port of the first transducer, the second input port connected to an input port of the second transducer; and
    an external magnetic field source for switching the magnetic switch, wherein in one switch state the first OFC appears at the output port and in another switch state the second OFC appear at the output port.

2. The system of claim 1,
    further comprising a third SAW device including a third transducer and reflectors in a third acoustic path providing a third OFC, wherein the input port of the third transducer is directly connected to the output port.

3. The system of claim 1, wherein the magnetic switch comprises a reed switch.

4. The system of claim 1, wherein a distance from the transducer to the reflectors in the second acoustic path changes by an odd integer multiple of a quarter wavelength of the reflectors center compared to the distance between the reflectors and the transducer in the first acoustic path.

5. A surface acoustic wave (SAW) device-based communications system, comprising:
    surface acoustic wave (SAW) encoded devices having plural reflector gratings coupled with a transducer; and a first SAW device including a first transducer and reflectors in a first acoustic path providing a first orthogonal frequency code (OFC), at least a second SAW device including a second transducer and reflectors in a second acoustic path providing a second OFC different from the first OFC;

a thin film ferromagnetic material connected with the first and second SAW devices, the placement of the thin film ferromagnetic material for changing a selected one of a delay, loss or frequency of the first and second SAW devices for adding pseudo noise (PN) coding to the first and second SAW devices, and an external magnetic field source for switching the PN coding of the first and second SAW devices.

6. The sensor of claim 5, wherein the first and second SAW devices include a delay path for providing the delay, wherein the thin film ferromagnetic material is placed in the delay path.

7. The sensor of claim 5, wherein the thin film ferromagnetic material is placed on the first and second transducer.

8. The sensor of claim 5, wherein the thin film ferromagnetic material is placed on one or more of the reflectors of the first and second SAW devices.

9. The sensor of claim 5, wherein the thin film ferromagnetic material comprises: a magnet integrated on top or bottom of the first and second SAW devices.

* * * * *